United States Patent [19]
Yoshino et al.

[11] Patent Number: 5,327,898
[45] Date of Patent: Jul. 12, 1994

[54] SIGNAL RECEIVING COIL DEVICE FOR MRI APPARATUS

[75] Inventors: Hitoshi Yoshino; Hiroyuki Takeuchi, both of Kashiwa, Japan

[73] Assignee: Hitachi Medical Corp., Tokyo, Japan

[21] Appl. No.: 908,176

[22] Filed: Jul. 2, 1992

[30] Foreign Application Priority Data

Oct. 11, 1991 [JP] Japan .................................. 3-290380
Dec. 13, 1991 [JP] Japan .................................. 3-351360

[51] Int. Cl.$^5$ ...................... A61B 5/055; G01R 33/20
[52] U.S. Cl. .................................. 128/653.5; 324/318
[58] Field of Search .................... 128/653.2, 653.5; 324/318, 322

[56] References Cited

U.S. PATENT DOCUMENTS

| | | | |
|---|---|---|---|
| 4,641,097 | 2/1987 | Bottomley et al. | 324/318 |
| 4,646,024 | 2/1987 | Schenk et al. | 324/318 |
| 4,720,680 | 1/1988 | Nishihara et al. | 324/322 |
| 4,728,894 | 3/1988 | Yoda et al. | 324/322 |
| 4,740,751 | 4/1988 | Misic et al. | 324/322 |
| 4,757,290 | 7/1988 | Keren | 324/318 |
| 4,780,677 | 10/1988 | Nissenson et al. | 324/322 |
| 4,793,356 | 12/1988 | Misic et al. | 128/653.5 |
| 4,825,163 | 4/1989 | Yabusaki et al. | 324/318 |
| 4,879,516 | 11/1989 | Mehdizadeh et al. | 324/318 |
| 4,887,039 | 12/1989 | Roemer et al. | 324/322 |
| 4,920,318 | 4/1990 | Misic et al. | 128/653.5 |
| 4,929,881 | 5/1990 | Yabusaki et al. | 324/318 |
| 5,132,621 | 7/1992 | Kang et al. | 324/322 |
| 5,144,239 | 9/1992 | Oppelt et al. | 324/318 |
| 5,168,233 | 12/1992 | Zibolski | 324/322 |
| 5,177,443 | 1/1993 | Gilderdale | 324/318 |
| 5,191,289 | 3/1993 | Hayakawa et al. | 324/318 |
| 5,212,450 | 5/1993 | Murphy-Boesch et al. | 324/322 |

FOREIGN PATENT DOCUMENTS

| | | |
|---|---|---|
| 1299542 | 5/1988 | Japan . |
| 284938 | 9/1988 | Japan . |
| 392137 | 9/1989 | Japan . |
| 0071896 | 2/1983 | PCT Int'l Appl. ............... 128/653.5 |

Primary Examiner—Lee S. Cohen
Assistant Examiner—Krista M. Pfaffle
Attorney, Agent, or Firm—Antonelli, Terry, Stout & Kraus

[57] ABSTRACT

A signal receiving coil device for an MRI apparatus, to be fitted to a patient for detecting nuclear magnetic resonance signals, comprising a coil member assuming a substantially cylindrical shape when fitted to the patient and having at least one flexible section and at least one rigid section disposed sequentially and alternately in a circumferential direction of said cylindrical shape; a first coil unit disposed on the coil holding member, and having a signal receiving direction thereof crossing substantially orthogonally the direction of a static magnetic field generated by the MRI apparatus when the coil holding member is fitted to the patient; and a second coil system disposed on the coil holding member, and having a signal receiving direction of reception thereof crossing substantially orthogonally both of the direction of the static magnetic field and the signal receiving direction of the first coil unit when the coil holding member is fitted to the patient.

11 Claims, 9 Drawing Sheets

F I G. 5
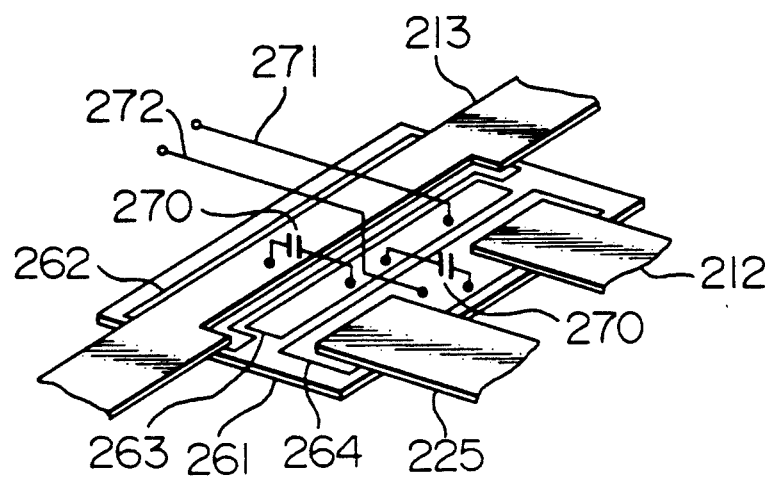
F I G. 6
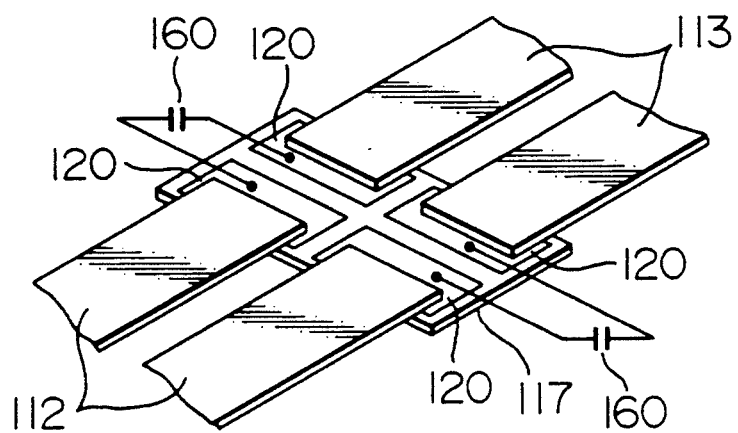

SIGNAL RECEIVING COIL DEVICE FOR MRI APPARATUS

BACKGROUND OF THE INVENTION

This invention relates to a signal receiving coil device for use in a magnetic resonance imaging apparatus (hereinafter referred to as the "MRI apparatus"). More in particular, it relates to a signal receiving coil device having flexibility such that it can be brought into close contact with a patient.

The MRI apparatus displays a tomographic image by placing a patient in a strong and homogeneous static magnetic field generated by a magnet for generating the static magnetic field, applying a high-frequency magnetic field and a gradient magnetic field to the patient in accordance with a predetermined pulse sequence so as to allow a nuclear spin of a predetermined section of the patient to cause nuclear magnetic resonance (hereinafter referred to as "NMR"), detecting the resulting NMR signals, and subjecting the detection signals to two-dimensional Fourier transform etc. for image reconstruction.

Detection of the NMR signals is effected by placing an high-frequency signal receiving coil in the proximity of the patient, and conventional detection methods include a method which receives unidirectional NMR signals by the use of a set of coil units such as solenoid coil units or saddle coil units, and a method which uses two sets of coil units, arranges them in such a manner that the directions of their sensitivity cross each another at right angles, and receives bidirectional NMR signals in order to improve a signal-to-noise ratio (S/N). Since the signal receiving directions of the two coil units are orthogonal to each other in the latter, the coils are referred to as "QD" (Quadrature Detection) coil unit.

The QD coils that have been proposed so far include a QD coil unit for a horizontal magnetic field comprising the combination of a saddle coil unit with another, for example, and a QD coil unit for a vertical magnetic field comprising the combination of a solenoid coil unit with the saddle coil unit, for example.

SUMMARY OF THE INVENTION

When the signal receiving coil device for the MRI apparatus is brought into closer contact with the patient, the sensitivity becomes higher and the S/N becomes higher, as well. However, the conventional QD coil units described above are fabricated by winding a coil on a bobbin made of a resin and having low flexibility. It is therefore difficult to bring the signal receiving coil device into closer contact with the patient, and the sensitivity as well as the S/N cannot be much high.

To bring the coil unit into closer contact with the patient and thus to improve the sensitivity and the S/N, the coil portion must be somehow provided with flexibility.

When the coil unit is provided merely with flexibility, the problem of coupling of two coil units occurs in the case of the QD coil unit.

The term "coupling" represents the state where a high-frequency current flows also through one of coil units when the high-frequency current is caused to flow through the other coil unit. The primary reason why this coupling takes place is that the gap of the crossing portion of the coil units is as small as a few millimeters, for example. Coupling includes capacitance coupling resulting from floating capacitance and inductive capacitance in which one of the coil units couples with the other by the resulting magnetic flux. This inductive coupling can be regulated by disposing a good conductor such as a copper plate in the proximity of the coil units so as to establish a balance of the magnetic flux, that is, so as to let the direction of sensitivity of one of the coil units to orthogonally cross that of the other coil unit. Although capacitance coupling cannot be regulated by this method, it can be dealt with by reducing in advance the floating capacitance between the coil units as small as possible. However, such a regulation or a counter-measure is based on the premise that the shape of each coil unit is, and remains, constant.

If the QD coil units are merely provided with flexibility, they are likely to undergo deformation because the degree of deformability is high, and if the QD coil units undergo deformation, the balance of the magnetic flux collapses greatly, so that coupling becomes great. The occurrence of coupling between the coil units means that mating coil unit becomes a load to each coil unit, and means also the drop of the S/N of detection and degradation of image quality. In other words, if the QD coil units are merely provided with flexibility, the S/N drops, on the contrary, because the degree of deformability of the QD coil units is too great.

If the QD coil units are merely provided with flexibility, the resonance frequencies of the two coil units are likely to take mutually different values in accordance with deformation of the QD coil units when the QD coil units are fitted to the patient under a deformed state so as to match the body shape of the patient. Here, the change of the resonance frequency due to the deformation of the QD coils is considered to result from the change of inductance of the coil units. When the QD coil units have a certain state of form, the resonance frequency $f_1$ of one of the coil units can be expressed by the equation below:

$$f_1 = \frac{1}{2\pi \sqrt{L_1 \cdot C_0}} \quad (1)$$

where $L_1$ is its inductance, and $C_0$ is a capacitance of a resonance circuit inclusive of that coil unit.

The capacitance $C_0$ comprises a capacitor and a variable capacitance diode (VCD), and the frequency can be regulated by, for example, applying a D.C. voltage to the variable capacitance diode to change its capacitance. When the capacitance is set to $C_0$ in this manner, the resonance frequency $f_1$ of the coil unit is brought into conformity with the nuclear magnetic resonance frequency. Assuming that the QD coil unit undergoes deformation to another certain form and has a resonance frequency $f_2$, then, the resonance frequency $f_2$ is given by the following formula with $L_2$ representing the inductance at that time, with the proviso that the capacitance remains unchanged:

$$f_2 = \frac{1}{2\pi \sqrt{L_2 \cdot C_0}} \quad (2)$$

Accordingly, the resonance frequency of one of the coil units changes from $f_1$ to $f_2$. This also holds true of the other coil units.

Let's consider a more definite case of QD coil unit comprising the combination of a solenoid coil unit and a saddle coil unit and provided with flexibility. Assuming that a certain height of the QD coil unit changes from 170 mm to 210 mm and that the resonance frequencies of the solenoid coil unit and saddle coil unit are in agreement with the nuclear magnetic resonance frequency at this height 170 mm, there is the case where the resonance frequency of the solenoid coil unit deviates by 350 KHz, for example, from the nuclear magnetic resonance frequency described above while the resonance frequency of the saddle coil unit deviates by 250 KHz, for example, from the nuclear magnetic resonance frequency, when the height of the QD coil unit is 210 mm. This is because the change of inductance $(L_1 - L_2)$ in the equations (1) and (2) is different between the solenoid coil unit and the saddle coil unit. When the QD coil unit undergoes deformation as described above, the deviation of the resonance frequency from the nuclear magnetic resonance frequency is different between the two coil units of the QD coil unit (e.g. solenoid coil unit and saddle coil unit). Accordingly, even though the resonance frequency of one of the coil units is brought into conformity with the nuclear magnetic resonance frequency by regulating the capacitance as already described, it is very difficult to bring the resonance frequency of the other coil unit into conformity with the nuclear magnetic resonance frequency. In other words, it is very difficult to bring the resonance frequencies of both of the two coil units into conformity with the nuclear magnetic resonance frequency. For this reason, the sensitivity of the QD coil unit drops as a whole, so that the S/N cannot be improved sufficiently in the NMR imaging apparatus and a quality image cannot be obtained.

It is therefore an object of the present invention to provide a signal receiving coil device for an MRI apparatus which can improve the S/N.

It is another object of the present invention to provide a signal receiving coil device for an MRI apparatus which has flexibility so as to bring into closer contact with a patient.

In accordance with one aspect of the present invention for accomplishing the object described above, there is provided a signal receiving coil device for an MRI apparatus, to be fitted to a patient for detecting nuclear magnetic resonance signals, comprising a coil holding member assuming a substantially cylindrical shape at least when fitted to the patient, and including at least one flexible section and at least one rigid section, each being disposed sequentially and alternately in a circumferential direction of the cylindrical shape; a first coil unit disposed on the coil holding member, and having a signal receiving direction thereof crossing substantially orthogonally a direction of a static magnetic field generated by the MRI apparatus when the coil holding member is fitted to the patient; and a second coil unit disposed on the coil holding member, and having a signal receiving direction thereof crossing substantially orthogonally both of the direction of the static magnetic field and the signal receiving direction of the first coil unit.

According to the signal receiving coil device for an MRI apparatus described above, the flexible section makes it easy to fit the coil device to the patient in close contact therewith, and the rigid section limits degree of deformation of the coil units. Accordingly, when the lengths of the flexible and rigid sections are selected appropriately in accordance with the portion of the patient to be imaged, the coil units can be brought into closer contact with the patient, and quadrature of the sensitivity directions of the two coil units can be maintained by limiting deformation which would otherwise change the sensitivity directions of the two coil units. Accordingly, a signal-to-noise ratio (S/N) can be improved.

The coil holding member described above may assume always a cylindrical shape. However, it is preferred that connectors for connecting and disconnecting each of the first and second coil units, respectively, are disposed at both end portions of the coil holding member while the coil holding member is shaped in a belt-like shape. In such a case, the coil device can be wound in closer contact with a desired portion of the patient (e.g. the waist), and fitting and removal of the coil device can be made more easily.

The first coil unit may be a solenoid coil unit and the second coil unit may be a saddle coil unit. Alternatively, both of the first and second coil units may be saddle coils.

The first and second coil units may be disposed in such a manner as to cross each other, and the crossover portion of the first and second coil units may be disposed on the rigid section. When the first and second coil units are so disposed on the coil holding member as to cross each other, the gap between the first and second coil units is reduced at the crossover portion due to deformation of the flexible section if the crossover portion exists on the flexible section. In this case, coupling of the two coil units is likely to occur. In contrast, if the crossover portion is disposed on the rigid section, deformation at the crossover portion is difficult to occur and hence, coupling described above is difficult to occur.

The coil holding member described above may be divided for each of the flexible sections and the rigid sections, and connectors for connecting and disconnecting each of the first and second coil units may be disposed at both end portions of each of the flexible and rigid sections. In this case, if a flexible unit is constituted by the flexible section, a part of the first coil unit and a part of the second coil unit each part being supported by the flexible section, and the connectors disposed at both end portions of the flexible section, and if a plurality of such flexible units having mutually different lengths between both end portions are prepared in advance, the coil device can be brought into close contact with the patient even when the physical size of the patient changes or the portion to be imaged changes, by exchanging the flexible unit in accordance with the size.

An inductor may be connected to at least one of the first and second coil units so that the change of a resonance frequency of the first coil unit becomes substantially equal to that of the second coil unit resulting from the deformation of these coil units when the coil holding member is fitted to the patient. In this case, the inductor thus connected makes substantially equal the changes of the resonance frequencies of the first and second coil units resulting from their deformation when the coil holding member is fitted to the patient. Accordingly, both resonance frequencies of the first and second coil units can be brought easily into conformity with the nuclear magnetic resonance frequency. Accordingly, the overall sensitivity of the coil device can be improved and the S/N can be improved, as well.

The inductor described above may be connected in series with at least one of the first and second coil units.

According to another aspect of the present invention, there is provided a signal receiving coil device for an MRI apparatus, to be fitted to a patient for detecting nuclear magnetic resonance signals, comprising a coil holding member assuming a substantially cylindrical shape at least when fitted to the patient, and provided with flexibility at least part thereof; a first coil unit disposed on the coil holding member, and having a signal receiving direction thereof substantially crossing orthogonally a direction of a static magnetic field generated by the MRI apparatus when the coil holding member is fitted to the patient; a second coil unit disposed on the coil holding member, and having a signal receiving direction thereof crossing substantially orthogonally both of the direction of the static magnetic field and the signal receiving direction of the first coil unit when the coil holding member is fitted to the patient; and an inductor connected to at least one of the first and second coil units so that the change of a resonance frequency of the first coil unit becomes substantially equal to that of the second coil unit resulting from deformation of the first and second coil units when the coil holding member is fitted to the patient.

According to this signal receiving coil device for an MRI apparatus, since the inductor is connected, the changes of the resonance frequencies of the first and second coil units resulting from their deformation when the coil holding member is fitted to the patient becomes substantially equal to each other. Accordingly, the resonance frequencies of both first and second coil units can be brought easily into conformity with the nuclear magnetic resonance frequency, so that the overall sensitivity of the coil device as well as the S/N can be improved.

The inductor described above may be connected in series with at least one of the first and second coil units.

BRIEF DESCRIPTION OF THE DRAWINGS

FIG. 5 is a perspective view showing in detail a joint portion between other coil members of the saddle coil unit of the coil device shown in FIG. 1;

FIG. 6 is a perspective view showing in detail a joint portion between coil members of the solenoid coil unit of the coil device shown in FIG. 1;

DESCRIPTION OF THE PREFERRED EMBODIMENTS

Hereinafter, some preferred embodiments of the present invention will be explained with reference to the accompanying drawings.

To begin with, a preferred embodiment of the present invention will be described with reference to FIGS. 1 to 9.

Figure 1:
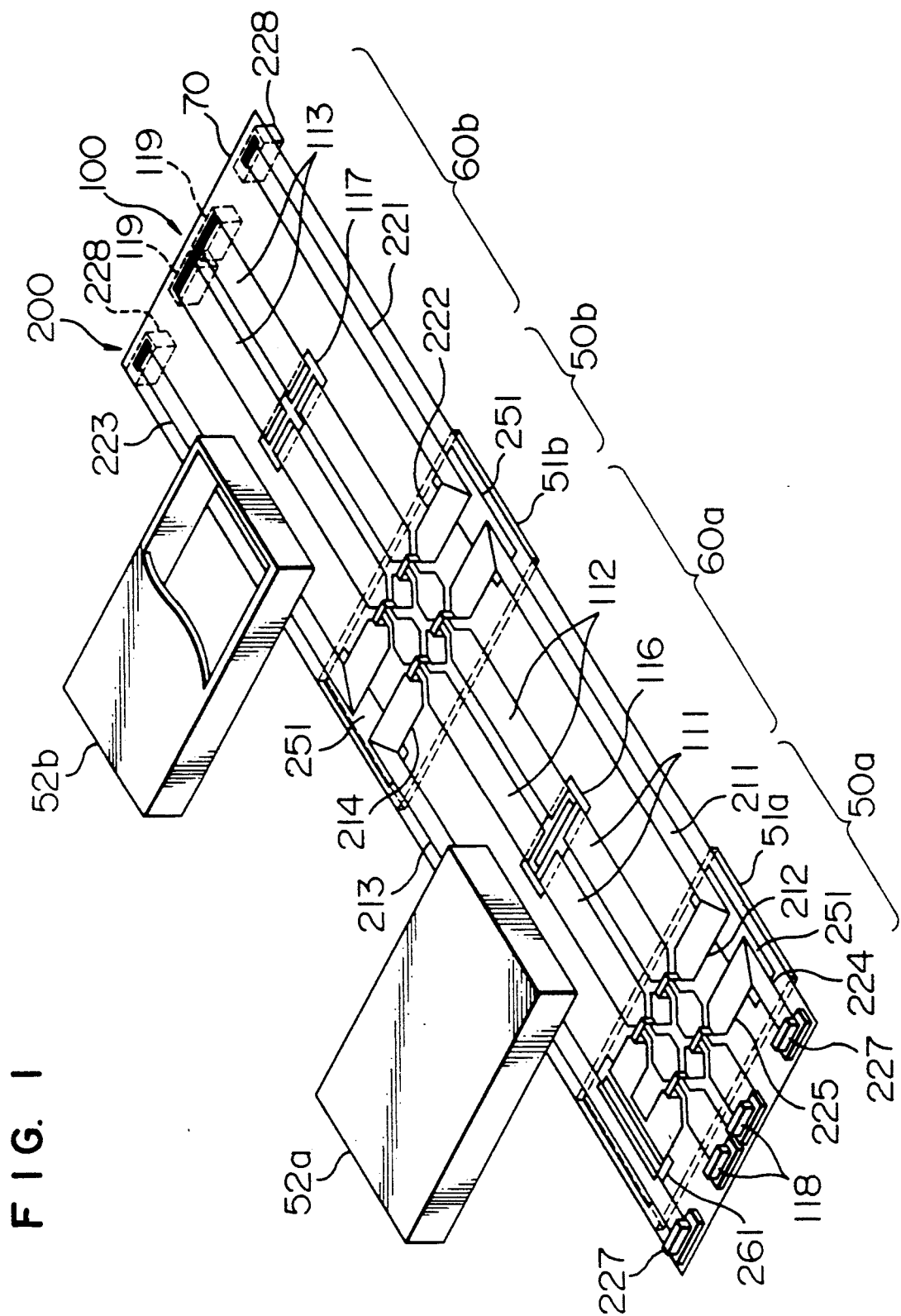
FIG. 1 is a perspective view showing a coil device according to an embodiment of the present invention.

FIG. 1 is a perspective view showing a coil device (QD coil unit) according to a first embodiment of the present invention. The coil device shown in the drawing is for use in a vertical magnetic field type MRI apparatus, and comprises broadly rigid sections 50a, 50b and flexible sections 60a, 60b. Two coil units are assembled in this coil device. These coil units comprise a solenoid coil unit 100 and a saddle coil unit 200. Each coil unit is formed on an about 0.5 mm-thick coil sheet 70 made of a resin and having a length such that it can be wound on a desired portion of a patient to be imaged. The rigid sections 50a, 50b described above are disposed at two positions on this coil sheet 70. In this embodiment, the rigid sections 50a, 50b are disposed at the crossover portion of the two coil units. Each rigid section 50a, 50b comprises a support plate 51a, 51b fixed to the surface of the coil sheet 70 not provided with the coil units, and a cover 52a, 52b removably fitted to the support plate 51a, 51b and protecting the crossover portion of the two coil units. The coils of the rigid sections 50a, 50b may be formed directly on the support plates 51a, 51b without being formed on the coil sheet 70.

Next, the two coil units will be explained. The two coil units comprise the solenoid coil unit 100 and the saddle coil unit 200 as described above. However, it is only when connectors 227, 118 and connectors 228, 119 disposed at both end portions of the coil sheet 70 are fitted to one another, respectively, that these coil units are formed as the coil. The solenoid coil unit 100 is formed in such a manner as to exist in a circumferential direction when the coil sheet 70 is so wound cylindrically as to encompass the periphery of the trunk of the body of the patient, for example, and the saddle coil unit 200 is disposed so that its signal receiving direction crosses orthogonally the signal receiving direction of the solenoid coil unit 100.

The structure of the saddle coil unit 200 will be explained first. The saddle coil unit 200 comprises a pair of coils. One of the coils constituting the saddle coil unit 200 comprises coil members 211, 212, 213, 214 made of a conductor material, e.g. a copper plate, three printed substrates 251, printed substrates 261 and later-appearing capacitors. The other coil constituting the saddle coil unit 200 comprises coil members 221, 222, 223, 224, 225, 213, the printed substrates 251, 261 and capacitors, two female connectors 227 and two male connectors 228. The conduction loop of the pair of coils constituting the saddle coil unit 200 has substantially the same length. Among the constituent members described above, the printed substrates 251 is disposed for mutually joining the coil members, and the printed substrate 261 are disposed for mutually joining the coil members and for connecting later-appearing lead wires 271, 272.

Next, the structure of the solenoid coil unit 100 will be explained. The solenoid coil unit 100 in this embodiment is fabricated by connecting in parallel two single-turn coils. In other words, the solenoid coil unit 100 is produced by connecting in parallel, through a printed substrate 116, two single-turn coils comprising coil members 111, 112, 113 made of a conductor material such as a copper plate, printed substrates 116, 117 disposed at the two joint portions between the coil members 111 and 112 and between the coil members 112 and 113, later-appearing capacitors, and male connectors 118 and female connectors 119 disposed at the end portions of the coil members 111 al 113.

The connectors 227, 228, 118, 119 in this embodiment are disposed so that the coil unit can be easily fitted to, and removed from, the patient. If this easiness in the fitting/removing operation is not requisite, it is also possible to employ the structure wherein the coil sheet 30 is formed into a cylindrical shape to omit the connectors and the predetermined coil members are connected to one another.

Figure 2:
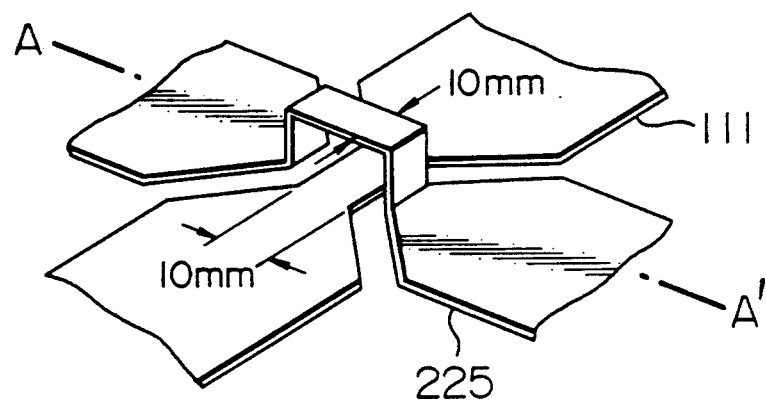
FIG. 2 is a perspective view showing in detail a crossover portion between a solenoid coil unit and a saddle coil unit in the coil device shown in FIG. 1.
Figure 3:
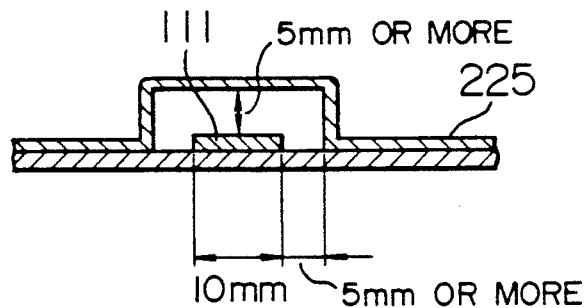
FIG. 3 is a sectional view taken along a line A—A' in FIG. 2.

Next, the detail of the structures of the two coil units 100, 200 will be explained. First of all, the crossover portion between the saddle coil unit 200 and the solenoid coil unit 100 will be explained. Fig 2 shows in detail the crossover portion between the coil member 225 of the saddle coil unit 200 and the coil member 111 of the solenoid coil unit 100. FIG. 3 is a sectional view taken along a line A—A' in FIG. 2. At already described, the floating capacitance between the coils is preferably reduced as much as possible beforehand in order to reduce the capacitive coupling between the coils.

This embodiment uses a copper plate having a predetermined width for the coil member. At the crossover portion of the coils, the width of the coil member 225 of the saddle coil unit 200 and the width oz the coil member 111 of the solenoid coil unit are reduced to a predetermined width and at the same time, the gap between these coil members is set to a predetermined value. If the width of the crossing coil members is 10 mm, for example, the gap is preferably at least 5 mm as shown in FIG. 3. The gap is preferably increased when the width of the crossing coil members greater.

Figure 4:
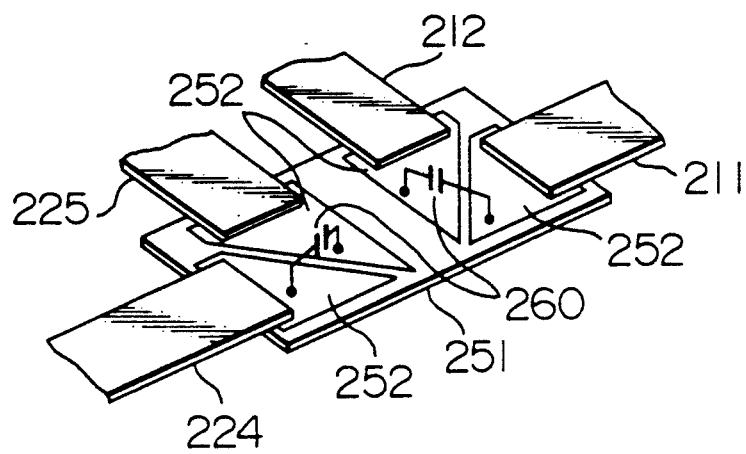
FIG. 4 is a perspective view showing in detail a joint portion between coil members of the saddle coil unit of the coil device shown in FIG. 1.

Next, the joint portions of each coil member will be explained with reference to FIGS. 4 to 7. FIGS. 4 and 5 show the detail of the joint portion between the coil members of the saddle coil unit. As shown in FIG. 4, the coil members 211 and 212 and the coil members 224 and 225 are connected to one another on the printed substrate 251 through the capacitors 260, respectively. The printed substrate 251 is disposed to hold by soldering the coil members lest they peel off from the coil sheet 70 when the coil sheet 70 is wound into a cylindrical shape, and to have the capacitors 260 easily fitted. Four, substantially triangular, conductor portions (print patterns) 252 having a portion a little wider than the coil members are disposed on the printed substrate 251, and each coil member and each capacitor 260 are soldered to each conductor portion 252. The joint portion between other coil members has fundamentally a similar structure.

Next, the signal output portion of the saddle coil unit 200 will be explained. The signal output portion of the saddle coil unit 200 is disposed at the portion of the printed substrate 261 in the rigid section 50a shown in FIG. 1. Its detail is shown in FIG. 5. Conductor portions 262, 263, 264 are disposed on the printed substrate 261, and the coil member 213 is soldered to the conductor portion 262. The coil members 212, 225 are soldered to the conductor portion 264, and the capacitors 270 are connected between the conductor portions 262 and 263 and between the conductor portions 263 and 264. Lead wires (signal lines) 271 and 272 of the coil unit are extended from the conductor portions 263 and 264.

Next, the joint portion between the coil members of the solenoid coil unit 100 and its signal input/output portion will be explained. FIG. 6 shows the connection of the coil members on the printed substrate 117 shown in FIG. 1. Four conductor portions 120 are formed on the printed substrate 117. The coil members 112 and 113 are soldered to these conductor portions, and the conductor portions to which the coil members 112 and 113 are connected, respectively, are in turn connected to one another through the capacitors 160, respectively.

Figure 7:
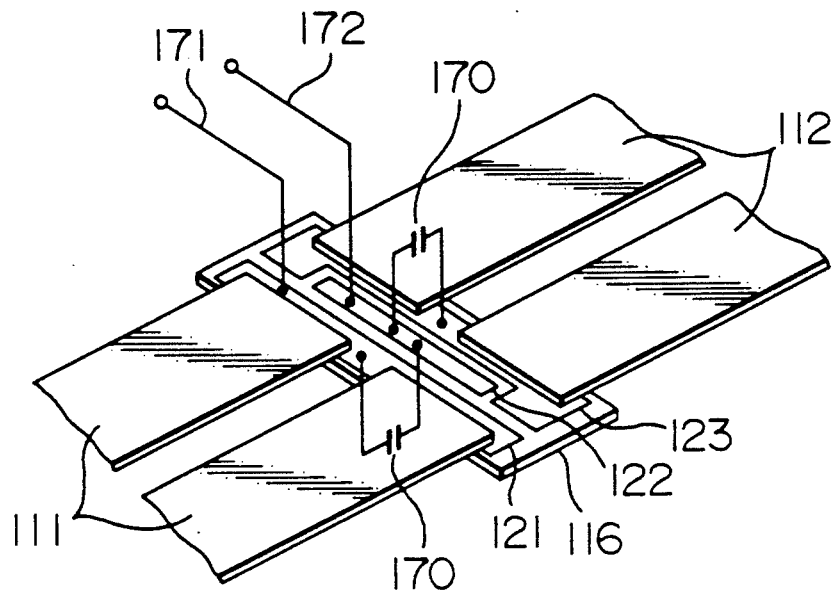
FIG. 7 is a perspective view showing in detail a signal output portion of the solenoid coil unit of the coil device shown in FIG. 1.

FIG. 7 shows the signal output portion of the solenoid coil unit 100. Three conductor portions 121, 122, 123 are formed at three positions of the printed substrate 116, and the coil members 111, 112 are soldered to these conductor portions. The conductor portions 121 and 122 are connected to each other through the capacitor 170 and the conductor portions 122 and 123 are likewise connected to each other through the capacitor 170. In this way, two single-turn coils are connected in parallel with each other. Lead wires (signal lines) 171 and 172 are extended from the conductor portions 121, 122 as the junction points.

Figure 8:
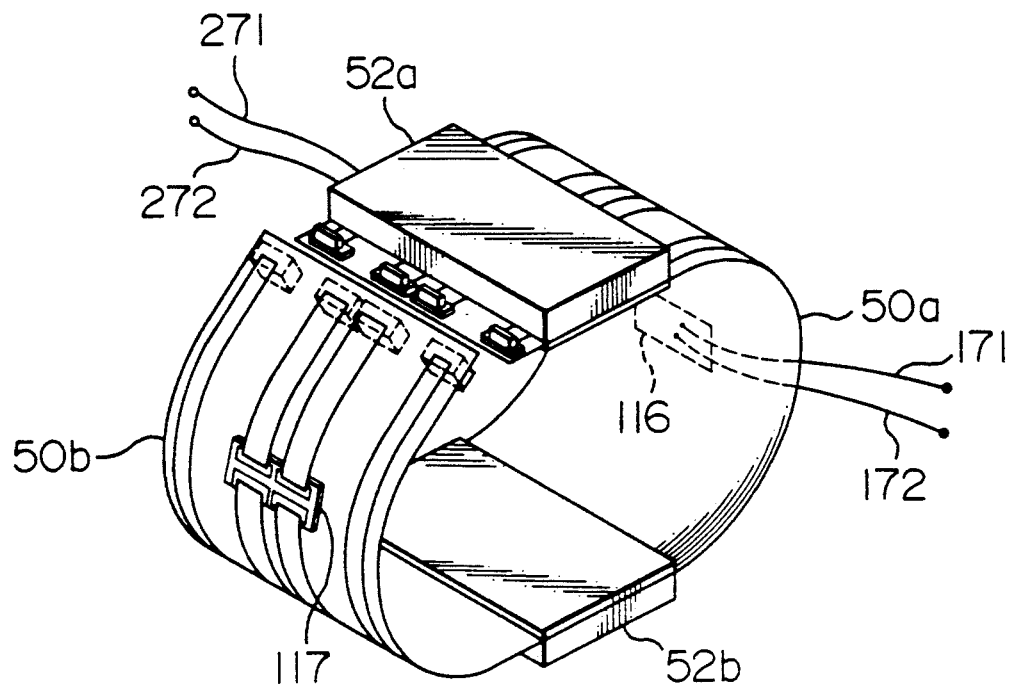
FIG. 8 is a perspective view showing the state when the coil device shown in FIG. 1 is fitted to a patient.

The coil device having the structure described above is fitted to the patient by winding its flexible sections 50a, 50b on the patient and then connecting the connectors 227, 228, 118, 119 to one another as shown in FIG. 8. The direction of the coil device at this time of winding is preferably such that the covers 52a, 52b shown in FIG. 1 are positioned outside. For, there is a protrusion at the crossover portion of the two coil units 200, 100 and if this protrusion is positioned inward, the coil unit is not brought into closer contact with the patient.

The coil device according to this embodiment is not flexible throughout its full length in the circumferential direction when it is wound into the cylindrical shape but comprises the flexible sections 60a, 60b and the rigid sections 50a, 50b. Accordingly, deformation of the coil device which would otherwise lose quadrature of the directions of sensitivity of the two coil units 200, 100 can be limited while permitting deformation in the radial direction. In other words, when the coil device is wound in match with the patient, overall deformation of the coil device into an elliptic cylindrical shape, for example, is permitted, and local deformation such as collapse of a part of the cylindrical shape becomes difficult to occur. Accordingly, this coil device can be brought into closer contact with the patient and moreover, can prevent the drop of the S/N while securing quadrature of the directions of sensitivity of the two coil units 200, 100.

Next, another embodiment of the present invention will be explained. In this embodiment, the coil device shown in FIG. 1 is divided into four portions, i.e. two rigid sections 50a, 50b and two flexible sections 60a, 60b, and these sections are connected by connectors. Hereinafter, this embodiment will be explained with reference to FIG. 9.

Figure 9:
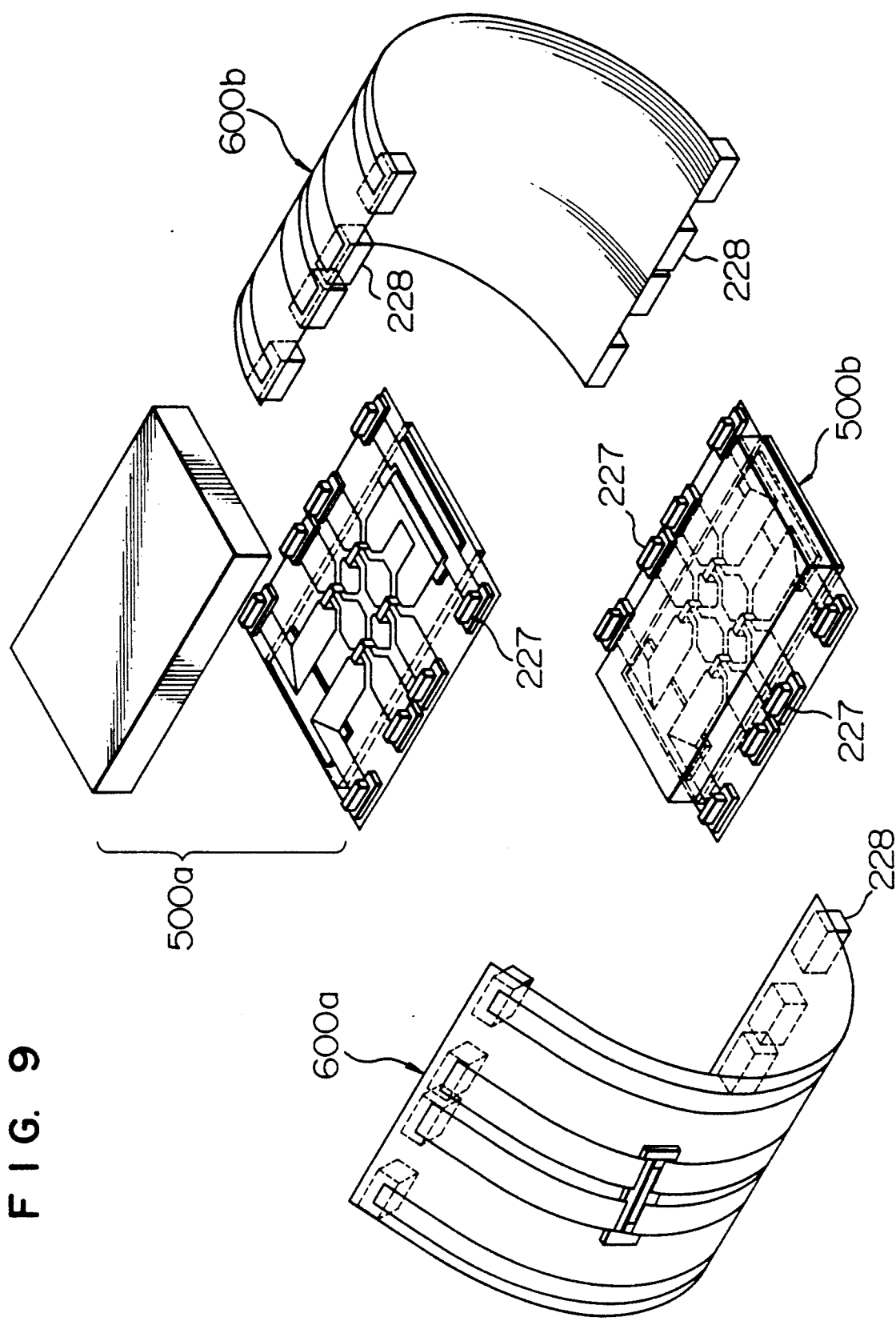
FIG. 9 is a perspective view showing a coil device according to another embodiment of the present invention.

In FIG. 9, reference numerals 500a and 500b denote the rigid sections and reference numerals 600a and 600b do the flexible sections. The rigid section 500a is formed by cutting off the flexible section 60a continuing the rigid section 50a shown in FIG. 1 and disposing the male connectors 227 on the coil members. A pair of coils constituting the saddle coil unit in this rigid section 500a are preferably shaped symmetrically with each other. The rigid section 500b is formed by cutting off the flexible sections 60a, 60b at both ends of the rigid section 50b shown in FIG. 1, and disposing the male connectors 227 on the coil members at both cut end portions. In this rigid section 500b, too, a pair of coils constituting the saddle coil unit are preferably shaped symmetrically with each other. The flexible sections 600a and 600b are formed by disposing the female connectors 228 at both ends of the remaining flexible section from which the rigid sections 500a and 500b are cut off in the coil device shown in FIG. 1 as described above. In this case, the length of the flexible section 600a is equal to that of the flexible section 600b.

Besides the set of the flexible sections 600a and 600b, this embodiment prepares a plurality of sets of flexible sections having different lengths for one set of the rigid sections 500a and 500b so that the flexible sections can be exchanged in the set unit in order to cope with the change of the imaging portion of the patient, or with the change of the physical size of the patient even when the same portion is to be imaged.

In the coil device of each of the foregoing embodiments of the present invention, the two coil units are disposed on the flexible coil holding members so that their signal receiving directions cross orthogonally each other, and the rigid sections are disposed so as to reduce the degree of deformability of the flexible members when they are shaped into the cylindrical shape. However, it is further preferred to prevent the occurrence of deformation such that diameters become mutually different at both end portions of the flexible section. One of the counter-measures would be the one that makes the rigidity in the circumferential direction of the cylindrical shape of the flexible member itself greater than the rigidity in the longitudinal direction (the direction diagonal to the circumferential direction). Methods which can be employed in this case include a method which fixes a reinforcing member to the flexible member, and a method which constitutes the flexible member itself by a composite member of fibrous materials and makes the number of fibers in the circumferential direction greater than the number of fibers in the longitudinal direction.

Figure 10:
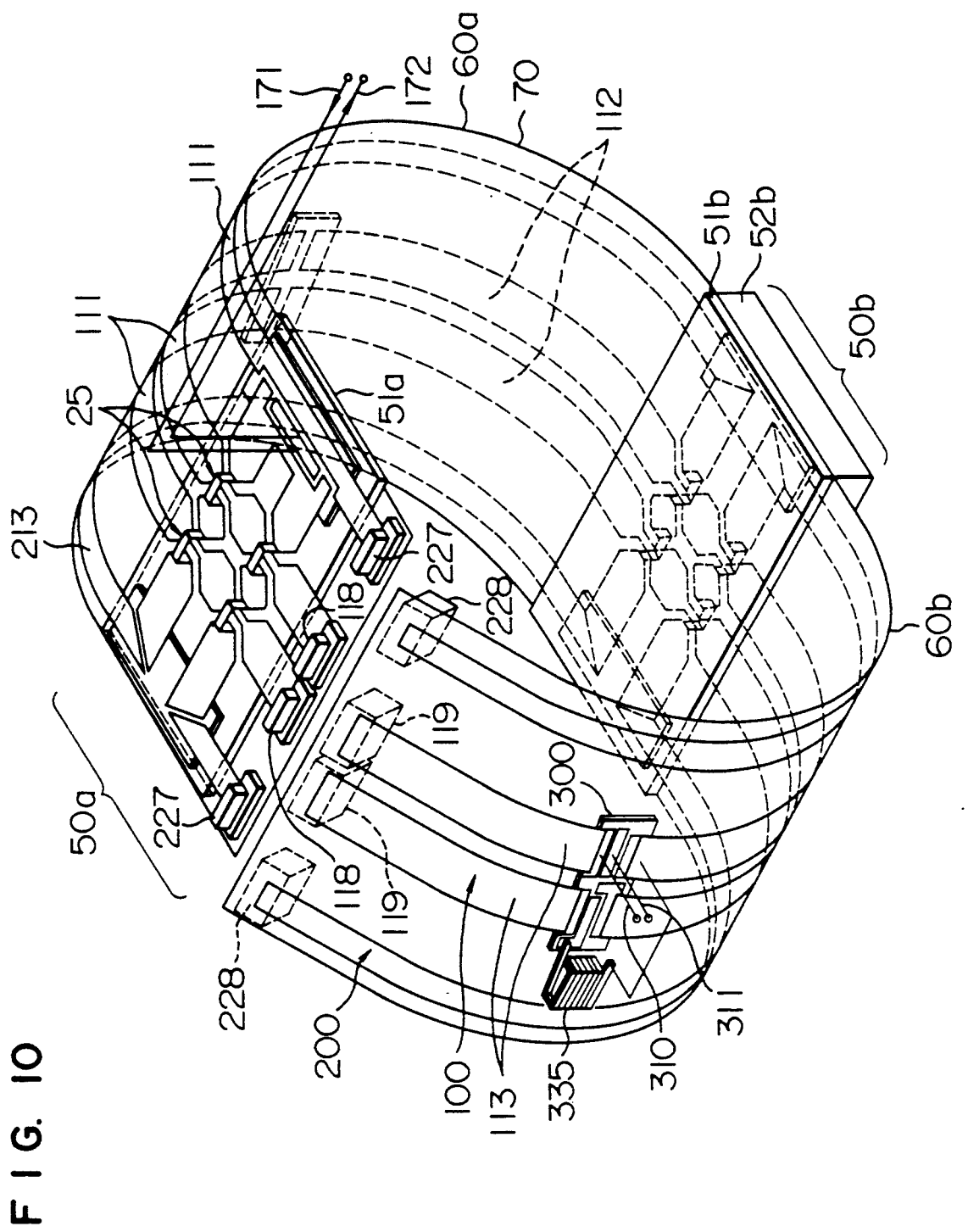
FIG. 10 is a perspective view showing the state when the coil device according to still another embodiment of the present invention is fitted to the patient.
Figure 11:
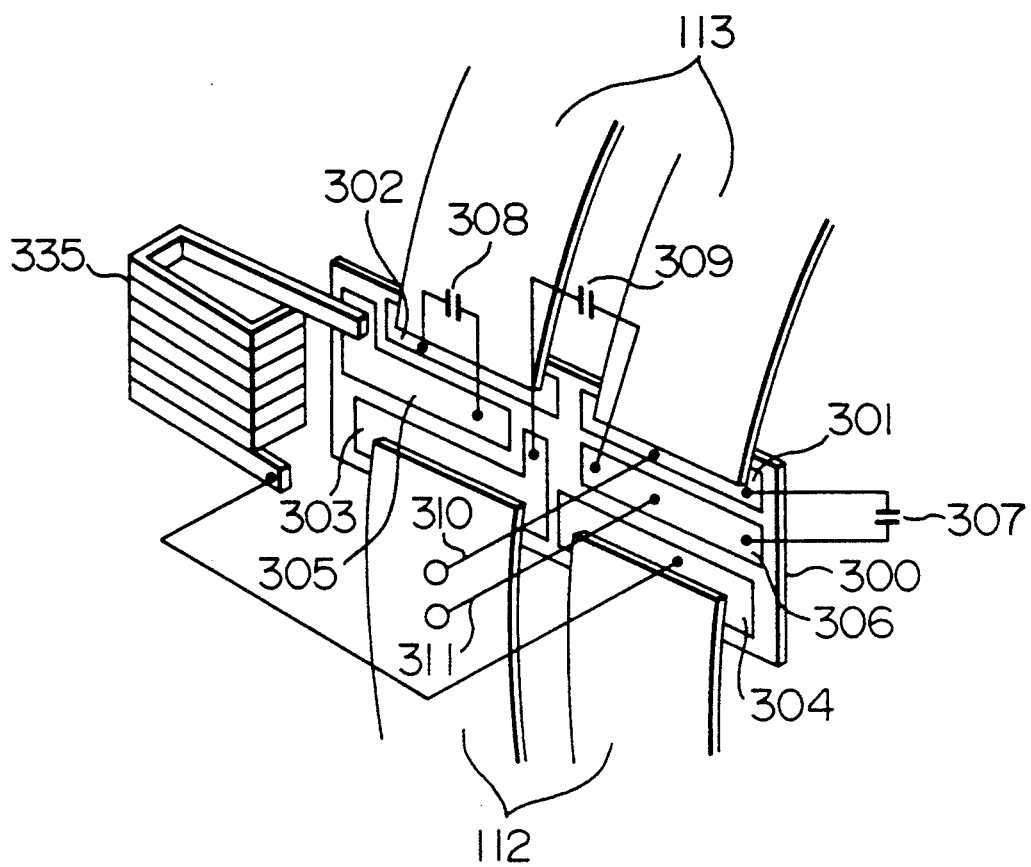
FIG. 11 is a perspective view showing in detail a joint portion between coil members of the solenoid coil unit of the coil device shown in FIG. 10 and its signal output portion.
Figure 12:
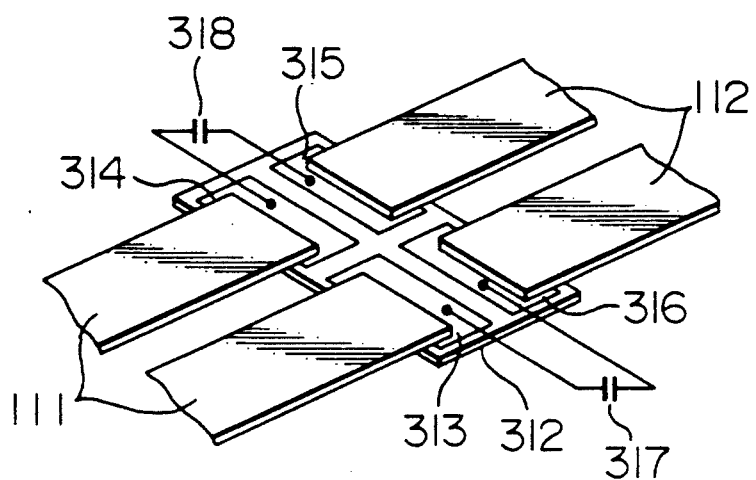
FIG. 12 is a perspective view showing in detail a joint portion between other coil members of the solenoid coil unit of the coil device shown in FIG. 10.

Next, still another embodiment of the present invention will be explained with reference to FIGS. 10 to 12. FIG. 10 is a perspective view showing the state when the coil device according to this embodiment is fitted to the patient, and FIG. 11 shows the joint portion between the coil members of the solenoid coil unit of the coil device shown in FIG. 10. FIG. 12 shows a joint portion between other coil members of the solenoid coil unit of the coil device shown in FIG. 10. In FIGS. 10 to 12, like reference numerals are used to identify like constituents as in the coil devices shown in FIGS. 1 to 8, and the repetition of explanation of such constituents will be omitted.

The difference of the coil device shown in FIGS. 10 to 12 from the coil devices shown in FIGS. 1 to 8 lies in that the portions shown in FIGS. 6 and 7 are changed to the portions shown in FIGS. 11 and 12, respectively. In other words, the solenoid coil unit 100 in this embodiment comprises two single-turn coils connected in series, and an inductor 335 is connected in series with an intermediate portion of the solenoid coil unit 100.

The explanation in further detail will be given. As shown in FIG. 11, the conductor portions 301, 302, 303, 304, 305 and 306 are formed on the printed substrate 300. The two coil members 113 are soldered to the conductor portions 301 and 302, respectively, and the two coil members 113 are soldered to the conductor portions 303 and 304, respectively. The conductor portions 301 and 306 are connected to each other by the capacitor 307, and the conductor portions 302 and 306 are likewise connected to each other by the capacitor 308. The conductor portions 303 and 306 are connected to each other by the capacitor 309, and the inductor 335 is interposed between the conductor portions 304 and 305. The lead wires (signal lines) 310 and 311 are extended from the conductor portions 301 and 306, respectively.

The conductor portions 313, 314, 315 and 316 are formed on the printed substrate 312 as shown in FIG. 12. The two coil members 111 are soldered to the conductor portions 313 and 314, and the two coil members 112 are soldered to the conductor portions 315 and 316. The conductor portions 313 and 316 are connected to each other by the capacitor 317 and the conductor portions 314 and 315 are connected to each other by the capacitor 318.

Since the inductor 335 is connected in series with the solenoid coil unit 100, it increases the inductance of the solenoid coil unit 100 as a whole. The resistance value of the inductor 335 results in the drop of the Q value of the solenoid coil unit. Therefore, the inductor 335 is made preferably of a wire material having a sectional area as great as possible.

When the coil device (QD coil unit) of this embodiment has the same form as in the case of the afore-mentioned equation (1) the resonance frequency $f'_1$ of the solenoid coil unit 100 is given by the following equation (3) where the inductance of the inductor 335 connected in series with the solenoid coil unit 100 is $\Delta L$, the capacitance of the resonance circuit inclusive of the solenoid coil unit 100 after this inductor 335 is connected is $C_1$ and the inductance of the solenoid coil unit is $L_1$:

$$f'_1 = \frac{1}{2\pi \sqrt{(L_1 + \Delta L) \cdot C_1}} \quad (3)$$

It will be hereby assumed that the resonance frequency $f'_1$ is in conformity with the nuclear magnetic resonance frequency by setting the capacitance to $C_1$ by the variable capacitance diode, etc, contained in the resonance circuit. Assuming that the inductance of the h solenoid coil unit 100 is $L_2$ when the coil device according to this embodiment changes to the same shape as in the case of the afore-mentioned equation (2) and the capacitance remains unchanged, $$f'_2 = \frac{1}{2\pi \sqrt{(L_2 + \Delta L) \cdot C_1}} \quad (4)$$

Here, since both of the resonance frequencies $f_1$ and $f'_1$ are in conformity with the nuclear magnetic resonance frequency, $f_1 = f'_1$. From the equations (1) and (3), therefore, $$C_1 = C_0 \times L_1 / (L_1 + \Delta L)$$

From this, the equation (4) may be rewritten as follows:

$$f_2 = \frac{1}{2\pi} \sqrt{\frac{1}{(L_2 + \Delta L)} + \frac{\Delta L/L_1}{(L_2 + \Delta L)}} / \sqrt{C_0} \quad (5)$$

It can be understood by comparing this equation (5) with the equation (2) that the resonance frequency of the solenoid coil unit 100 when the coil device undergoes deformation can be changed by the inductance $\Delta L$ of the inserted inductor 335. In other words, the change of the resonance frequency can be obviously regulated by the inductance $\Delta L$ to be inserted.

It can be understood from the explanation given above that the change of the resonance frequency of the solenoid coil unit 100 can be regulated by inserting in series the inductor 335 having a certain value into the solenoid coil unit, and this change can be brought into conformity with the change of the resonance frequency of the saddle coil unit 200 by determining the inductance value of the inductor 335 to be inserted to an appropriate value by experiments, etc. In the example of the deformation of the coil device described above in which the height changes from 170 mm to 210 mm, the $\Delta L$ value of the inductance to be inserted proves about 0.4 $\mu$H when calculated in accordance with the equation (4) on the basis of the changes of the resonance frequencies of the solenoid coil unit 100 and saddle coil unit 200. The inventors of the present invention have confirmed through the experiments using the inductance value $\Delta L$ described above that the change of the resonance frequency is 259 KHz for both of the coil units.

Since the inductor 335 is connected as described above, the degree of the change of the resonance frequency of each of the coil units 100, 200 resulting from the deformation of the solenoid coil unit 100 and the solenoid coil unit 200 when the coil device is fitted to the patient can be made substantially equal to each other. Accordingly, it becomes easier to bring the resonance frequency of each of these coil units into conformity with the nuclear magnetic resonance frequency, so that the sensitivity of the coil device can be improved as a whole and a diagnostic image having higher image quality can be obtained by improving the S/N in the MRI apparatus.

In this embodiment, the inductor 335 is shown inserted into the intermediate portion of the solenoid coil unit 100, but it may be connected in series with the intermediate portion of the saddle coil unit 200. Alternatively, inductors having suitable values may be inserted to the intermediate portions of the solenoid coil and saddle coil units 100, 200, respectively. When the inductor 335 is inserted into the intermediate portion of either one of the solenoid coil unit 100 and the saddle coil unit 200, the inductor is preferably connected to the coil unit exhibiting a greater change of the inductance by examining the change of the inductance of each of the coil units 100, 200 due to the deformation when the coil device is fitted around the patient. In this embodiment, the rigid sections 50a, 50b are shown disposed at one of the ends and intermediate portion of the flexible coil sheet 70, but the rigid sections 50a, 50b need not always be disposed.

Each of the foregoing embodiments represents the combination of the solenoid coil unit 100 and the saddle coil unit 200 as the QD coil unit of the vertical magnetic field type, but the present invention is not limited to such a case and can be therefore applied to the combination of the saddle coil unit and another saddle coil unit as the QD coil unit of the horizontal magnetic field type, and to the combinations of various other kinds of coil units.

Figure 13:
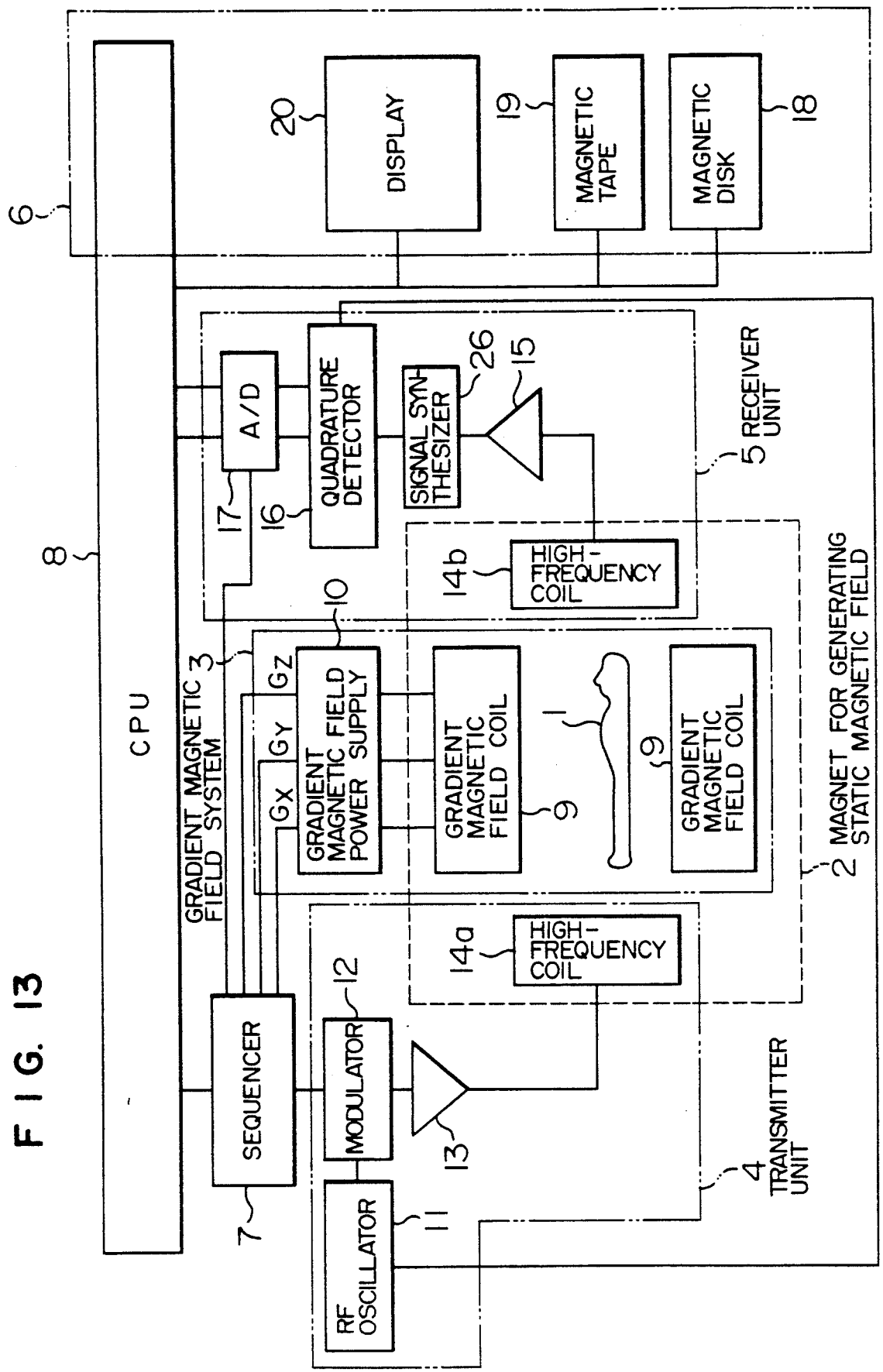
FIG. 13 is a block diagram showing an example of the construction of an MRI apparatus using the coil device according to the present invention.

Next, an example of the MRI apparatus using the coil device of the invention described above will be explained. FIG. 13 is a block diagram showing such an MRI apparatus.

The MRI apparatus obtains a tomogram of the patient by utilizing the nuclear magnetic resonance (NMR) phenomenon, and comprises a magnet 2 for generating a static magnetic field, a gradient magnetic field system 3, a transmitter unit 4, a receiver unit 5, a signal processor unit 6, a sequencer 7 and a central processing unit (CPU) 8.

The static magnetic filed generation coil 2 generates a homogeneous static magnetic field in a direction of the body axis of the patient 1 or in a direction crossing orthogonally the body axis around the patient 1. Magnetic field generation means of a permanent magnet type or resistive magnet type or superconductive magnet type is disposed inside a space having a certain expansion around the patient 1. The gradient magnetic field system 3 comprises gradient magnetic field coils 9 wound in the direction of three axes, i.e. X, Y and Z, and a gradient magnetic field power supply 10 for driving each coil. When the gradient magnetic field power supply 10 for each of these coils is driven in accordance with the instruction from the sequencer 7, each of the gradient magnetic fields Gx, Gy and Gz in the three-axes direction X, Y and Z is applied to the patient 1. The slice plane to the patient 1 can be set by the method of applying these gradient magnetic fields.

The transmitter unit 4 irradiates a radio frequency signal (electromagnetic wave) to generate nuclear magnetic resonance in the atomic nucleus of the atoms constituting the living texture of the patient 1. It comprises a high-frequency oscillator 11, a modulator 12, a high-frequency amplifier 13 and a high-frequency transmission coil 14a. The high-frequency pulse outputted from the high-frequency oscillator 11 is amplitude-modulated by the modulator 12 in accordance with the instruction from the sequencer 7, and after this amplitude-modulated high-frequency pulse is amplified by the amplifier 13, the amplified high-frequency pulse is supplied to the transmission coil 14a disposed close to the patient 1 so that the electromagnetic wave can be irradiated to the patient 1.

The receiver unit 5 detects the high-frequency signal (NMR signal) emitted by the nuclear magnetic resonance of the atomic nucleus of the living texture of the patient 1, and comprises a high-frequency reception coil 14a, an amplifier 15, a signal synthesizer 26, a quadrature detector 16 and an A/D convertor 17. The high-frequency signal (NMR signal) generated from the patient 1 in response to the electromagnetic wave irradiated from the transmission coil 14a is detected by the reception coil 14b disposed in the proximity of the patient 1, is inputted to the A/D convertor 17 through the amplifier 15 and through the quadrature detector 16, and is converted to a digital quantity by the A/D converter 17. Furthermore, this high-frequency signal is sampled by the quadrature detector 16 at the timing given by the instruction from the sequencer 7 to obtain two series of collected data, and the data signals are transmitted to the signal processor unit 6.

The coil device according to the present invention described above is used for the reception coil 14b.

The signal processor unit 6 comprises the CPU 8, a recording unit such as a magnetic disk 18 and a magnetic tape 19, and a display such as a CRT. The CPU 8 executes processings such as Fourier transform, calculation of correction coefficients, image reconstruction, and so forth, converts a signal intensity distribution of an arbitrary section or slice, or a distribution obtained by executing appropriate arithmetic operations of a plurality of signals, to an image, and displays the resulting image as a tomogram on the display 20.

The sequencer 7 operates under the control of the CPU 8, and functions as means for sending various instructions necessary for acquiring data of the tomogram of the patient 1 to the transmitter unit 4, the gradient magnetic field system 3 and the receiver unit 5, and for generating the sequence for measuring the NMR signal described above. In FIG. 13, the transmission coil 14a of the transmitter unit and the reception coil 14b of the receiver unit and the gradient magnetic field coils 9, 9 are disposed inside the magnetic field space of the magnet 2 for generating the static magnetic field.

Figure 14:
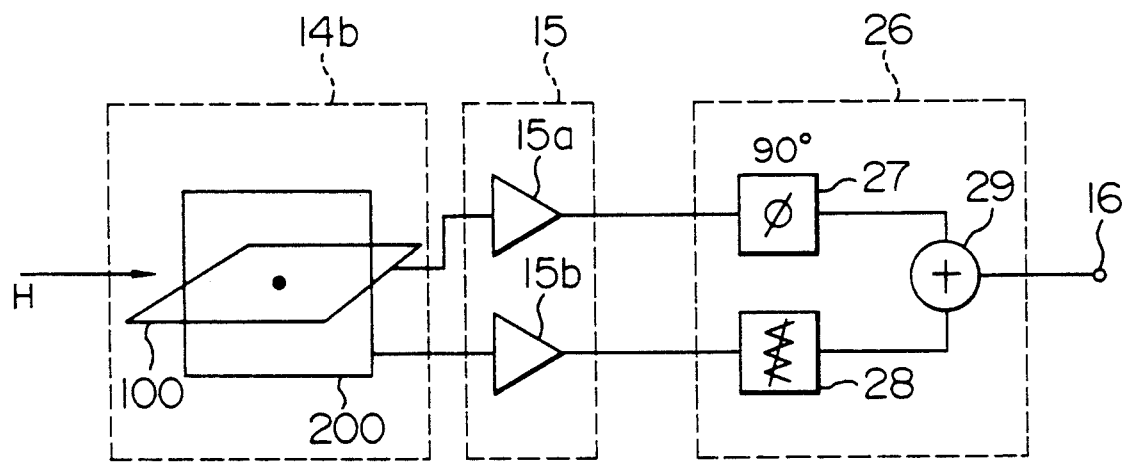
FIG. 14 is a block diagram showing in detail an example of a signal receiving circuit of the MRI apparatus shown in FIG. 14.

FIG. 14 is a circuit diagram of a part of the receiver unit 5. In FIG. 14, a tuning circuit for the coils, etc, is omitted to simplify the explanation. In the drawing, the direction of the static magnetic field is represented by an arrow S, and a magnetization vector rotating in one plane induces the same signal having a 90° phase difference in the solenoid coil unit 100 and the saddle coil unit 200 constituting the reception coil 14b. Here, since the solenoid coil unit 100 and the saddle coil unit 200 are disposed in such a fashion that the direction of their sensitivity cross orthogonally each other, the high-frequency signals (NMR signals) involving mutually independent random noises are detected. The factors that can be this noise source are the resistance of each coil unit 100, 200 and the equivalent resistance from the patient 1 resulting from magnetic and electric coupling of these coil units 100, 200.

The signals from both of these coil units 100, 200 are amplified by first and second amplifiers 15a, 15b inside the amplifier 15, respectively, and are then inputted to a signal synthesizer 26. The signal synthesizer 26 comprises a phase shifter 27, an attenuator 28 and an adder 29. The phase of the signal from the solenoid coil unit 100 is deviated by 90° by the phase shifter 27 and is brought into conformity with the phase of the signal from the saddle coil unit 200. On the other hand, the sensitivity of the saddle coil unit 200 is not equal to that of the solenoid coil unit 100 and when the sensitivity of the former is "1", for example, the sensitivity of the latter is "1.4". Accordingly, a high S/N cannot be obtained unless the addition ratio of the signals in the adder 29 is changed. The optimum addition ratio at this time is $1^2 \div 1.4^2 = 0.51$. Accordingly, the attenuator 28 is inserted into the intermediate part of the signal line from the saddle coil unit 200 and the addition ratio is regulated so that the signal from the saddle coil unit 200 becomes "0.51" when the signal from the solenoid coil unit 100 is "1". After the signal intensity from both coil units 100, 200 is thus matched, both signals are added by the adder 29 and the addition signal is outputted from the signal synthesizer 26. The output signal from the signal synthesizer 26 is sent to the quadrature detector 16 shown in FIG. 13.

When the phases of the signals from both coil units 100, 200 are matched with each other by the phase shifter 27 and the signals are added by the adder 29, the detection signal becomes considerably greater, though the noise becomes somewhat greater, too. As a result, the S/N becomes greater. If the dimension and shape of one (100) of the coil units are equal to those of the other (200) and if the equivalent resistances from the patient 1 described above are also equal to each other, the detection signal becomes twice and the noise becomes $\sqrt{2}$ times, so that the S/N can be improved $\sqrt{2}$ times.

We claim:

1. A signal receiving coil device for an MRI apparatus, to be fitted to a patient for detecting nuclear magnetic resonance signals, comprising:

a coil holding member including at least one flexible section and at least one rigid section, each flexible and rigid section being disposed sequentially and alternately in a predetermined direction;

a first coil unit disposed on said coil holding member, and having a first signal receiving direction; and a second coil unit disposed on said coil holding member, and having a second signal receiving direction crossing substantially orthogonally said first signal receiving direction of said first coil unit.

2. A signal receiving coil device for an MRI apparatus according to claim 1, further including connector means, disposed at predetermined portions of said coil holding member, for connecting and disconnecting said first and second coil units, respectively.

3. A signal receiving coil device for an MRI apparatus according to claim 1, wherein said first coil unit is a solenoid coil unit and said second coil unit is a saddle coil unit.

4. A signal receiving coil device for an MRI apparatus according to claim 1, wherein both of said first and second coil units are saddle coil units.

5. A signal receiving coil device for an MRI apparatus according to claim 1, wherein both of said first and second coil units are so disposed on said coil holding member as to cross one another, and the crossover portion of said first and second coil units is disposed on said rigid sections.

6. A signal receiving coil device for an MRI apparatus according to claim 1, wherein said coil holding member is divided into a plurality of said flexible sections and a plurality of said rigid sections, and further includes connector means, disposed at both end portions of each of said flexible sections and at both end portions of each of said rigid sections, for connecting and disconnecting said first and second coil units, respectively.

7. A signal receiving coil device for an MRI apparatus according to claim 6, wherein said flexible sections, a part of said first coil unit, a part of said second coil unit and said connector means disposed at both end portions of said flexible sections constitute a flexible unit, said part of said first coil unit and said part of said second coil unit being supported by said flexible sections.

8. A signal receiving coil device for an MRI apparatus according to claim 1, wherein an inductor is connected to at least one of said first and second coil units so that the change of a resonance frequency of said first coil unit resulting from deformation of said first coil unit is substantially equal to the change of a resonance frequency of said second coil unit resulting from deformation of said second coil unit, when said coil holding member is fitted to said patient.

9. A signal receiving coil device for an MRI apparatus according to claim 8, wherein said inductor is connected in series with at least one of said first and second coil units.

10. A signal receiving coil device for an MRI apparatus, to be fitted to a patient for detecting nuclear magnetic resonance signals, comprising:
- a coil holding member provided with flexibility at least at a part thereof;
- a first coil unit disposed on said coil holding member, and having a first signal receiving direction;
- a second coil unit disposed on said coil holding member, and having a second signal receiving direction crossing substantially orthogonally said first signal receiving direction of said first coil unit; and
- an inductor connected to at least one of said first and second coil units so that the changes of resonance frequencies of said first and second coil units resulting from deformation of said first and second coil units when said coil holding member is fitted to said patient become substantially equal to each other.

11. A signal receiving coil device for an MRI apparatus according to claim 10, wherein said inductor is connected in series with at least one of said first and second coil units.

* * * * *